United States Patent [19]
Berger et al.

[11] Patent Number: 5,260,151
[45] Date of Patent: Nov. 9, 1993

[54] DEVICE MANUFACTURE INVOLVING STEP-AND-SCAN DELINEATION

[75] Inventors: Steven D. Berger, Chatham; Marvin Leventhal, Summit; James A. Liddle, Chatham, all of N.J.

[73] Assignee: AT&T Bell Laboratories, Murray Hill, N.J.

[21] Appl. No.: 814,953

[22] Filed: Dec. 30, 1991

[51] Int. Cl.⁵ .......................... G03F 9/00; G03C 5/00
[52] U.S. Cl. ........................... 430/5; 430/311; 430/396; 430/321
[58] Field of Search .............. 430/5, 22, 269, 311, 430/396, 296, 321; 378/34, 35; 156/643

[56] References Cited

U.S. PATENT DOCUMENTS 4,780,382 10/1988 Stangl et al. .................... 430/5

OTHER PUBLICATIONS

P. Dahl, *Introduction to Electron and Ion Optics*, Academic Press, New York, N.Y. (1973).
L. M. Myers, *Electron Optics*, Van Nostrand Co., Inc., New York (1939).
*Magnetic Electron Lenses*, P. W. Hawkes, ed., Springer-Verlag, New York (1982).
Ludwig Reimer, *Transmission Electron Microscopy*, pp. 86-99, Spring-Verlag, New York (1984).
"Beam Processing Technologies", *VLSI Electronics Microstructure Science*, ed. N. G. Einspruch et al, Academic Press, v. 21, pp. 157-203 (1989).
Timoshenko, "Theory of Plates and Shells", McGraw Hill (1940), pp. 228-229.

*Primary Examiner*—Marion E. McCamish
*Assistant Examiner*—S. Rosasco
*Attorney, Agent, or Firm*—George S. Indig

[57] ABSTRACT

Fabrication of submicron design rule large scale integrated circuits depends upon use of a strut-segmented mask with struts providing mechanical support to permit thinned mask segments consequently yielding improved resolution. "Stitching"—positioning of projected segment images to yield a satisfactory continuous image—is aided by lithographically defined skirts forming a continuous border within strut-supported segments.

17 Claims, 3 Drawing Sheets

DEVICE MANUFACTURE INVOLVING STEP-AND-SCAN DELINEATION

BACKGROUND OF THE INVENTION

1. Technical Field

The invention is concerned with a fabrication of devices best exemplified by Large Scale Integrated circuits built to submicron design rules, e.g. <0.5 μm. Relevant fabrication entails projection lithography using charged particle delineating energy-either electron or ion.

2. Description of the Prior Art

The relentless drive toward LSI of increasing miniaturization-of increasing chip capacity-has given rise to a number of evolving fabrication approaches. All depend on lithographic delineation of capability beyond that used in the manufacture of state-of-the-art devices—beyond that used in the manufacture of $\approx 0.9$ μm design rule, 1 megabit chips.

Presently used near-UV lithography may be extended to appreciably smaller design rules-perhaps through use of phase masks. At some level wavelength limitations for electromagnetic radiation in the near-UV, or even deep-UV spectrum, will require a different radiation source. Relevant effort at this time largely concerns use of radiation in the x-ray spectrum.

Increasingly, advantages of charged particle over x-ray delineation—of electron or ion beam delineation—is leading to investigation of this approach. Electron beam projection lithography has the potential to become a tool of choice for fabrication of <0.5 μm design rule devices. Experience gained, in design and construction of imaging electron optics in microscopy over a period of sixty years, and in direct-write electron beam lithography over a period of twenty years, both establishes feasibility and offers insight into appropriate apparatus/process design. Feasible accelerating voltages in the 50-200 kV range (to result in 50-200 keV electrons) translates into equivalent wavelengths of $\approx 0.054-0.025$ Å—considerably better than need for contemplated design rules—to substantially increase depth of focus, thereby relaxing criticality of processing parameters and increasing yield. Well-developed approaches to electron optics permit attainment of projection with image demagnification which facilitates fabrication of now-enlarged masks.

Use of absorbing stencil (aperture) masks imposes significant restrictions on lithography. This approach precludes annular and other such peripheral mask features—a limitation overcome by use of complementary mask pairs which, however, doubles the per-level exposure requirement with consequent increased cost in throughput, in overlay registration, and in yield. In addition, decreasing absorption accompanying increasing accelerating voltage in blocking regions of the mask forces a compromise between image contrast and resolution.

Co-pending patent application Ser. No. 390,139, filed Aug. 7, 1989 offers a process making use of implicit advantages of electron beam lithography to bypass use of aperture masks. The key feature substitutes scatter-non-scatter for absorption-transparency masking. Discrimination offered by an apertured scatter filter positioned on the ray cross-over plane before the wafer—with aperture generally on the optical axis—permits the $\approx 50-200$ kV accelerating voltage desired for resolution and feature spacing, while offering image contrast at the 80% level and higher. The process is known as SCattering with Angular Limitation in Projection Electron-beam Lithography.

Promise for the SCALPEL approach, particularly for the fractional micron design rules contemplated, follows from reduced mask thickness as permitted by dependence on scattering angle rather than absorption. Simply stated, sufficient image contrast is achievable by means of far thinner masks. A scattering angle of the order of 50 mrad, statistically realizable by five electron-atom events (collisions or sufficiently close passage to result in meaningful deflection due to field interaction), is achievable in blocking region thicknesses of the order of 500-2000 Å.

Considerations including those above lead to use of a "membrane" mask. A mask, depending for feature support upon a film or membrane of a thickness of the order of 500-2000 Å, supporting "blocking" (scattering regions), also of a thickness of the same order, clearly yields requisite contrast for submicron design rules for at least an order of magnitude over the range below $\approx 0.5$ μm. This is appropriate for mask-to-wafer demagnification in the range of 4×-5×.

As aggravated by enlarged mask size due to image demagnification, the mask, now about 5 cm wide (for 5×demagnification to yield a 1 cm chip), does not have the required mechanical integrity. Sagging/distortion, caused for example by local heating, resulting from partial or complete particle absorption, interferes with attainment of the extreme precision required for such design rules.

SUMMARY OF THE INVENTION

Image reconstruction on the object plane based on use of a strut-segmented mask, taking advantage of precisely controlled charged particle delineating beams—electron or ion—permits realization of improved image characteristics corresponding with reduced mask thickness. Contemplated masks may depend upon blocking regions presenting sufficient absorption or scattering—upon blocking regions of supported thickness within the 500-2000 Å range or thinner. Pass regions may be made up of apertures or, alternatively, of clear regions—either of sufficient transparency to offer requisite contrast with absorption regions, or sufficiently nonscattering and of transparency to meet requirements for use with blocking regions based on scattering. Masks for use in accordance with the inventive processes are supported by struts for lending required mechanical integrity—rigidity, sag resistance, thermally induced distortion, etc.—for intervening mask segments. A contemplated mask structure entails parallel struts to define intervening functional mask regions which are rectalinear—of long dimension to yield the entirety of the pattern to be replicated in that direction. An embodiment depends upon a continuous grill made up of crossing x- and y-direction struts—another may provide for triangular segments. Such mask regions (or segments) may be co-extensive with a total chip pattern.

Independent of the particular strut pattern, the inventive teaching critically depends upon an inner "skirt" intermediate struts and pattern to be replicated—in most instances, such skirt embraces both sides of the strut. In the instance of crossing struts, skirt structure resembles a border within the "picture frame" of each strut-defined segment.

A primary function of the skirt is to afford precisely positioned and sized usage segments to enable construction/reconstruction of the projected image. Concisely stated, the invention is dependent upon separation of the two functions—that of mechanical mask integrity as primarily resulting from struts, and that of image precision resulting from skirts. Construction/reconstruction to omit strut image—to "stitch" segments as strut-separated on the mask, thereby producing a continuous image on the wafer—is advanced by the preferred embodiment which provides for skirt delineation/fabrication during and as an integral part of delineation/fabrication of associated device patterning. In accordance with this embodiment, this skirt is expediently produced from the same material and of the same thickness as that responsible for feature-defining regions of the mask image—again, either absorbing (as likely for ion masking), or scattering (as useful for electron masking—e.g. for use in SCALPEL). The approach permits pattern delineation and development to yield the skirt as part of the chip-patterning procedure with economies in processing cost and yield.

An additional function of the skirt—whether part of a one-dimensional or two-dimensional grill—may be described as "beam-forming". It has been observed that delineating particle energy—electron or ion—as viewed from the source—likely includes a "fall-off" or "wing" region of diminishing intensity. Wings, generally not usefully contributing to patterning, may result in unwanted heating—particularly of heating of struts—to contribute to unwanted image distortion. Optimal design of the inventive process provides for lessening of strut heating caused by such wings. The mask skirt is designedly of minimum width dimension orthogonal to the strut to substantially account for beam wings. Skirts dependent on scattering (e.g. as part of a scattering-nonscattering mask) are most effective in disseminating wing energy. The alternative structure—in which skirts are characterized by absorption—also lessens unwanted strut heating. Mask material—membrane as well as blocking regions—is desirably chosen with a view to thermal conductivity, to result in distribution of wing-induced heating, thereby lessening distortion due to local thermal gradients.

Lateral skirt dimension as discussed under the Detailed Description may be of such width as to both accommodate dimensional variations, placement errors, etc., as well as to perform such "beam-forming" function. An attribute of the invention in this respect is permission of greater tolerance for such irregularities, which, in turn, reduces mask cost.

Feasibility of use of such a strut-supported mask is due to the attribute of charged particle illumination permitting precise and rapid control of incident beam position. As enhanced by the implicit precision of skirt dimension—the same precision associated with mask feature generation—image reconstruction of the precision required is directly due to beam control as afforded by interaction with a field—magnetic or electrostatic.

The invention is generally described in terms of a likely approach—that dependent upon a simple segmented mask with image reconstruction dependent upon "stitching" of sequentially projected adjacent segments. The controllability expediting the approach—as due to ready precise control of a charged particle beam—applies to alternative approaches. For example, programming may provide for repeating use of one (or more) segments, e.g. providing for stitching of recurring segments. In this sense, the mask may serve as a "segment catalog" in whole or in part containing a relatively small number of segments to be selected and used several times—in spaced or proximate position—in imaging. In a sense, this variation provides for an imaging procedure more properly described as image "construction" rather than "reconstruction"—the former term, considered generic, is generally used in the following. The same mechanistic approach, as expedited by this attribute of charged particle delineation, permits omission of one or more segments in image construction. In similar fashion, a segment catalog may provide for redundancy—for mask inclusion of two or more identical segments so permitting replacement of initially defective or subsequently damaged segments.

Departure from the simple concept—that of a continuous chip pattern mask which is simply segmented—may give rise to further economy in cost as well as in equipment size. A segment catalog, even providing for redundancy, may contain substantially fewer segments as designed for repeating use. This may permit use of a smaller mask with various beneficial implications—e.g. lessened mask cost. Reduction in size of the mask permits associated reduction in apparatus—both concerning accommodation of the mask, and, perhaps more importantly, in the lens system. Reduction in apparatus size has beneficial implications in terms of required space and of cost. Alternatively, permitted reduction in segment count on the mask, in turn, permits a greater reduction ratio from mask to wafer for given apparatus size.

Processes of the invention may benefit by use of "scatter filters" which selectively pass or block delineating radiation as based on scatter angle—generally as imposed by the mask. For processes dependent upon pattern-delineating information as introduced into the radiation by means of a scatter-non-scatter mask, the scatter filter may selectively pass or block nominally unscattered radiation. The former function may be served by a simple aperture in an otherwise blocking plate with the aperture located on the optic axis. Selective passage of scattered radiation may take the form of a similarly located annular aperture (of course providing for support for the centrally located blocking region—possibly by use of one or more finely dimensioned strands). The scatter filter may function, in systems dependent on an absorption-transmission mask as well as on scatter-non-scatter, to lessen edge scattering, for which purpose it will depend upon a centrally located aperture.

It is common practice to discuss relevant optical systems in terms of delineating radiation made up of parallel rays at the mask. In these terms—in which nominally unscattered delineating rays as emerging from the mask are parallel to the optic axis—the scatter filter is placed on the back focal plane of the system. Under these circumstances, the back focal plane defines the position at which such rays cross over. Under other circumstances, the crossover plane does not coincide with the back focal plane—in turn, dictating placement of the scatter filter elsewhere. Placement of the scatter filter on the crossover plane permits reduction in aperture size to permit better discrimination based on scatter angle—in the instance of scatter-non-scatter imaging, to permit maximum resolution.

A passing note—the scatter filter may serve the additional function of defining numerical aperture. Alternatively, a second aperture filter may be designed to specifically serve this function.

BRIEF DESCRIPTION OF THE DRAWING

FIG. 2A depicting the mask; and FIG. 2B, showing a magnified section, both in perspective.

FIG. 4, consists of: FIG. 4A depicting a pattern as segmented for mask making; FIG. 4B showing a corresponding region of such mask; and FIG. 4C showing the constructed image as it appears on the resist.

DETAILED DESCRIPTION

The Drawing

FIG. 1

Figure 2:
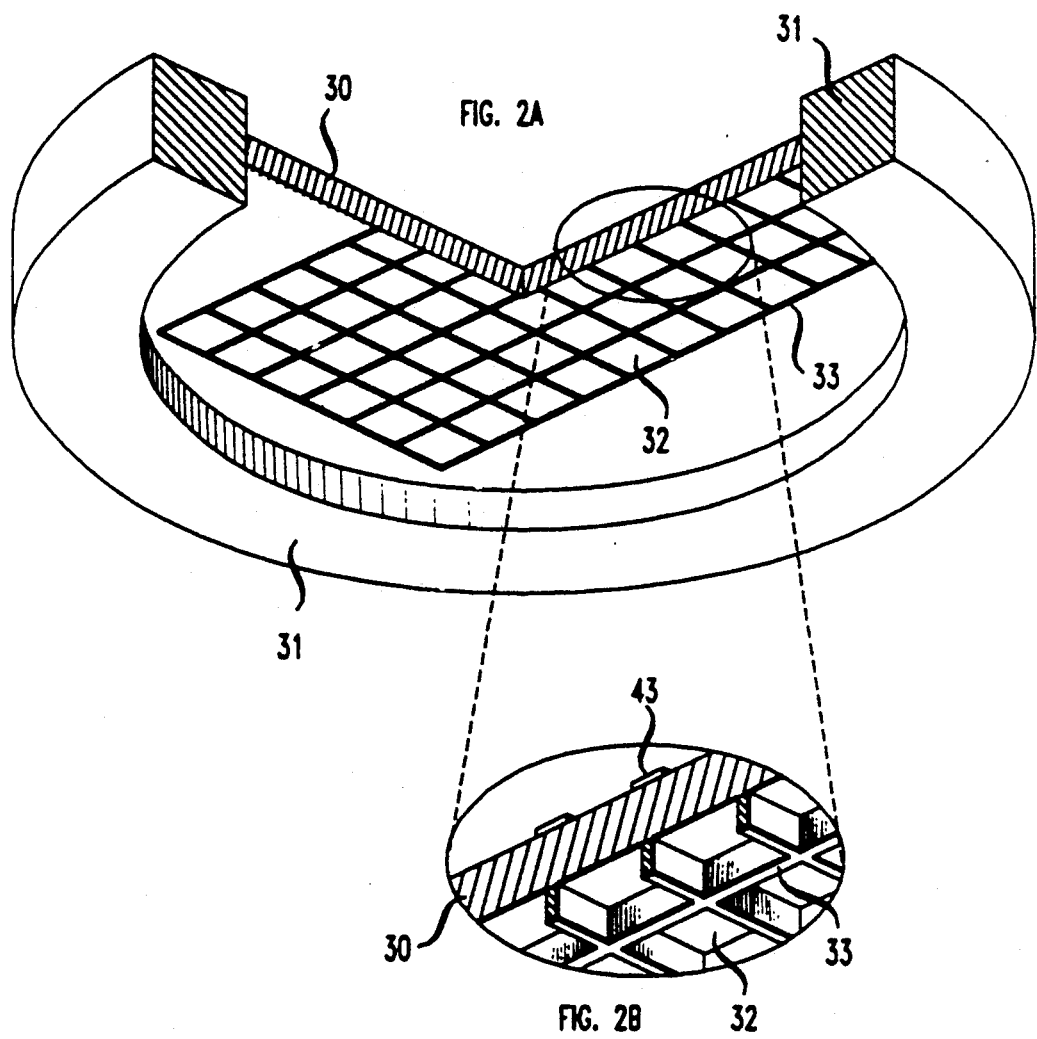
FIG. 2 depicts a representative mask of the invention. It includes.

This figure schematically depicts time-sequential illumination of a mask 10 by reference to illumination of two adjacent segments, in this instance, adjacent segments 25 and 26. Accordingly, segment 25 is first illuminated by means of particle rays 11, and, subsequently segment 26 is illuminated by means of particle rays 12. Mask 10 as shown, consists of a membrane 13 which, in the instance of the apparatus depicted, is unapertured. An aperture mask, as likely used for ion delineation as discussed elsewhere, would effect no other change in the figure as shown. For the embodiment in which rays 11 and 12 are constituted of electrons, preferably at velocity produced by accelerating voltage in the 50-200 kV range (yielding 50-200 keV electrons), membrane 13 consists of a continuous sheet of sufficient transparency and insufficient scattering for requisite imaging. Illustratively, such a membrane may consist of a 0.1 μm thick sheet of polycrystalline silicon, of crystallite size to which image requirements are tolerant—e.g. one-fifth of the minimum feature dimension. The developed mask image is defined by blocking regions 14, in this instance scattering regions, for example, as constituted of polycrystalline tungsten. Satisfactory experimental results were obtained by use of blocking regions 14 of a thickness of the same order of magnitude as that of the membrane 10—in one set of experiments, of blocking regions of a thickness of 0.05 μm (50 nm or 500 Å). Skirt regions 15, in accordance with a preferred aspect of the invention, are of the same material and thickness as for blocking/scattering regions 14, so resulting in the same degree of blocking—e.g. the same degree of scattering (for the preferred SCALPEL process). Supporting struts 16, discussed in description of FIG. 2, are, illustratively, of thickness 0.1 mm and of height 1.0 mm as seen by rays 11/12, and are spaced to define a mask segment —illustratively a 1 mm segment between struts 16.

Emerging rays 11a and 12a depict that portion of delineating energy not encountering and, consequently, not scattered by blocking regions 14 or skirt regions 15. Portions of illuminating radiation—e.g. electron rays—incident on patterning regions 14 and on skirt regions 15 and statistically scattered to such extent as not to reach the wafer plane, are not shown.

Unblocked illumination, consisting, in sequence, primarily of rays 11a and of rays 12a is caused to converge by means of electromagnetic/electrostatic first projector lens 17, thereby producing emerging rays 11b and 12b to result in cross-over e.g. of rays 11c and 12c at position 18, as depicted, on the plane of apertured scatter filter 19. As discussed, filter 19 is on the back focal plane for the instance in which rays 11a and 11b are parallel to the optic axis.

Second projector lens 22 is of such configuration and so powered as to bring the rays of each of the bundles—of the bundles made up of rays 11c and 12c—into parallel relationship. In the instance of rays 11d—the rays of the bundle on optical axis—for illustration purposes, action of lens 22 is sufficient to result in orthogonal, on-axis, incidence on wafer 24. For off-axis bundles—e.g. the bundle made up of rays 12c—redirection is required, i.e. such as to compensate for—to skip over—struts 16 as well as skirts 15. This "stitching" action is the responsibility of stitching deflectors 20 and 21. Deflectors 20 are so energized as to redirect off-axis rays such as rays 12c to result in positioned rays now denoted 12d. The function of deflectors 21 is to bring about final directional control so as to result in rays 12e—for the procedure depicted, positioned in juxtaposition to rays 11d so as to eliminate images of associated struts 16 and skirts 15.

As elsewhere in this disclosure, description is largely confined to apparatus and process aspects uniquely concerned with the invention. Applicable art is at a sophisticated level—a level which minimizes deleterious effects of implicit as well as likely-encountered aberrations. The inventive teaching may be implemented using all such apparatus and processing as well as future variations. Lenses such as 17 and 22 are illustrative. It is inappropriate to include detailed design/processing conditions, all of which are readily available from the literature. Experts in this area are well aware of equipments and designs appropriate to focusing, and, more generally, to charged particle direction as so influenced. Reference to standard texts such as P. Dahl, *Introduction to Electron and Ion Optics*, Academic Press, New York (1973) reveals interchangeability of electrostatic and magnetic (likely electromagnetic) lenses.

Reference to elements 17 and 22 is to be construed accordingly. Representative structures depicted are ring-shaped bipoles, with activating coils not shown. While it is likely that commercial apparatus will take this form at least initially, the depiction is intended as representative only. Reference to these elements as "lenses" is in accordance with convention. Lens functions are performed by the field patterns produced by the depicted structures. The numbered elements shown are, in fact, the generators of, and not the consequent field pattern upon which reliance is had. By the same token, depiction of but two such "lenses" is itself representative. Imaging desirably entails a minimum of two lenses—real apparatus, designedly compensating for a variety of aberrations to be encountered, may usefully include one or more additional lenses.

Back Scattered Electron Detector 23 is included for the purpose of monitoring current, i.e. the number of charged particles incident on the detector. Use may be based on conformity with calculated results or with simple empirical observation of previous conditions found adequate.

As noted above, design of appropriate projection apparatus may be based on appropriate text material as, e.g. P. Dahl, *Introduction to Electron and Ion Optics*, Academic Press, New York (1973); L. M. Myers, *Electron Optics*, Van Nostrand Co., Inc., New York (1939);

and *Magnetic Electron Lenses*, P. W. Hawkes, ed., Springer-Verlag, New York (1982). Useful design approaches for electron delineation may benefit from experience gained from electron microscopy, and direct-write equipment.

Figure 3:
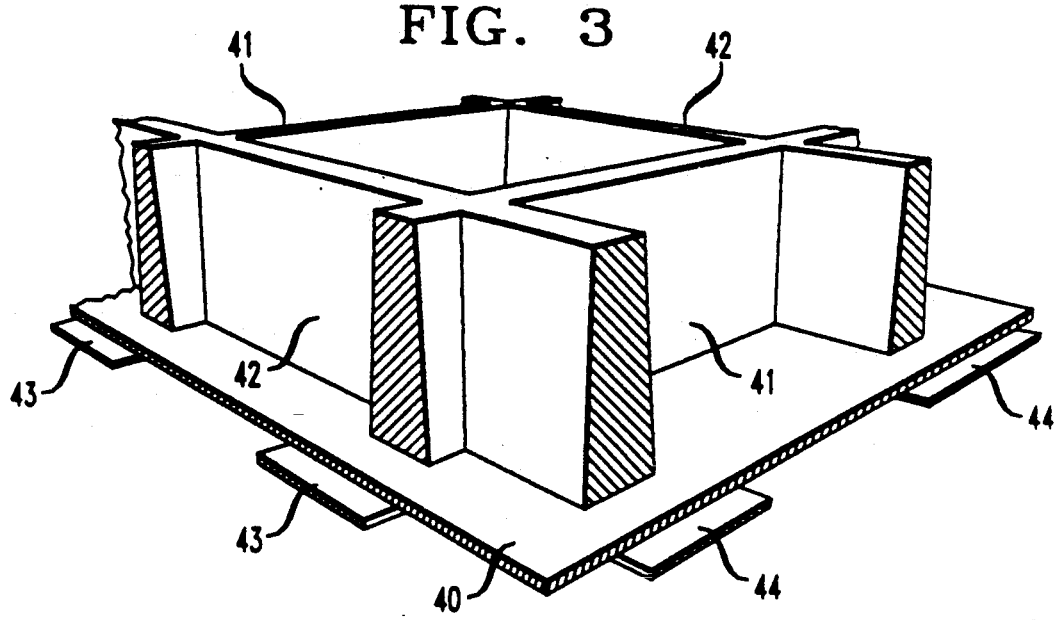
FIG. 3, is a perspective view of a mask segment showing both struts and skirts.

As elsewhere in this disclosure, specific description is illustrative. For example, stitching is discussed in terms of ray bundles which are of normal incidence to the wafer. In fact, there are contemplated circumstances under which such bundles are not necessarily of normal incidence-under which ray bundles are of specific varying angle of incidence. U.S. patent application, Ser. No. 07/852272 Mar. 16, 1992, is specifically directed to an approach which may serve as a preferred species of the present invention. That application entails movement of the image-in-formation, either of a segment portion or entirety or, alternatively of a scanning beam in which patterning illumination incident on the wafer may be skewed. Struts 42, as depicted in FIG. 3, may be tapered to the degree required to accommodate such "skew scanning".

Description of this figure, consistent with discussion elsewhere, is primarily in terms of variants resulting from the invention. The figure assumes an appropriate source of particles, e.g. as constituting rays 11 and 12. Well-known sources, appropriate for electron as well as ion irradiation, are described elsewhere. See, Ludwig Reimer, *Transmission Electron Microscopy*, pp. 86–99, Spring-Verlag, New York (1984); and "Beam Processing Technologies", *VLSI Electronics Microstructure Science*, ed. N. G. Einspruch et al, Academic Press, v. 21, pp. 157-203 (1989).

A suitable source provides for electrons emitted by a single crystalline lanthanum hexafluoride source as accelerated to 70 keV energy. (A suitable cathode source is described in *Transmission Electron Microscopy* cited above.) Available sources at this time may yield electrons accelerated to 70 KeV±5 eV with brightness of about $1 \times 10^6$ amps/cm$^2$/strad and current of about 5 mA. An aperture of about 1 mrad may serve as the entrance pupil to the illumination lens to result in an effectively parallel beam of about 1 mm$^2$ cross-section and of substantially uniform intensity. The emerging beam as incident on a mask such as mask 13 of FIG. 1 instantaneously illuminates the entirety of a 1 mm segment as contemplated in the discussion of that figure. The emerging, now-patterned beam is then focused under influence of a first projector lens (such as lens 17) to result in focus within the 100 μm diameter aperture of a scatter filter (consistent with focal length of 10 cm and an acceptance angle of 1 mrad for an apertured scatter filter such as filter 19 shown in FIG. 1). Subsequent passage through a second projector lens and shifting as by stitching dipole deflectors 20 and 21 results in reconstruction of the wafer image.

Description has been in terms of mask-to-wafer reduction, likely of 4× to 5× reduction ratio. Principles of the invention are equally applicable to other mask-to-wafer reduction ratios as well as to 1:1 systems, and even to enlargement (although little anticipated need is seen for the latter at this time).

FIG. 2

FIG. 2A depicts a strut-supported membrane mask 30. Mask 30 is supported by ring 31, the latter constructed of suitable rigidity and tolerance of temperature and other conditions to be encountered. Assuming a 4× mask 30 bearing a single chip pattern designed to yield a state-of-the-art≈1 cm chip, the inside diameter of ring 31 may be≈5–6 cm. Thickness as well as height of ≈1 cm have been found adequate for a glass ring.

As shown in FIG. 2B, the skirt 34-enclosed mask area is strut-supported by a grill of struts, 33, to result in segments. Considering a one gigabyte DRAM of functional chip area 35×17 mm$^2$ and a mask-to-wafer demagnification ratio of 4:1, the mask 30 depicted has a mask area of 140 mm×68 mm. The detail view of FIG. 2B shows two segments, 32, as defined by skirts 34 and supported by struts 33 each of thickness, W≈0.1 mm, and of height, Z≈1.0 mm, leaving a center-to-center segment spacing, L, of≈1.0 mm. Membrane 30 is characteristically of thickness, t, in the range of 500 Å–2000 Å. Dimensions listed have been found appropriate for silicon or silicon nitride membrane material and for struts constructed of elemental silicon or silica-based glass. Support strut dimensions set forth are conservative—result in sagging of less than≈2 μm overall—adequate to result in needed precision for design rules of 0.1 μm. Final design is likely to be empirical. In general terms, sag is proportional to L$^4$; stiffness is proportional to t$^3$ (to the third power of membrane thickness).

FIG. 3

This figure shows mask segment 40 as supported by struts 41 and 42. Struts in this instance are positioned so as to result in center-to-center—segment spacing of a total span of 1.3 mm to allow for skirts 43 and 44—to yield a functional 1.0 mm mask segment, and the imaging region of the mask. Such dimensions are appropriate for a membrane thickness, t, in the range of 500–1000 Å. Struts 41 and 42 are tapered, as depicted, from a maximum thickness of≈0.1 mm where contacting the mask to a minimum of perhaps 0.08 for a height of about 1 mm. As previously discussed, tapering is useful for accommodating the form of scanning described in U.S. patent application Ser. No. 07/852,272.

Figure 4:
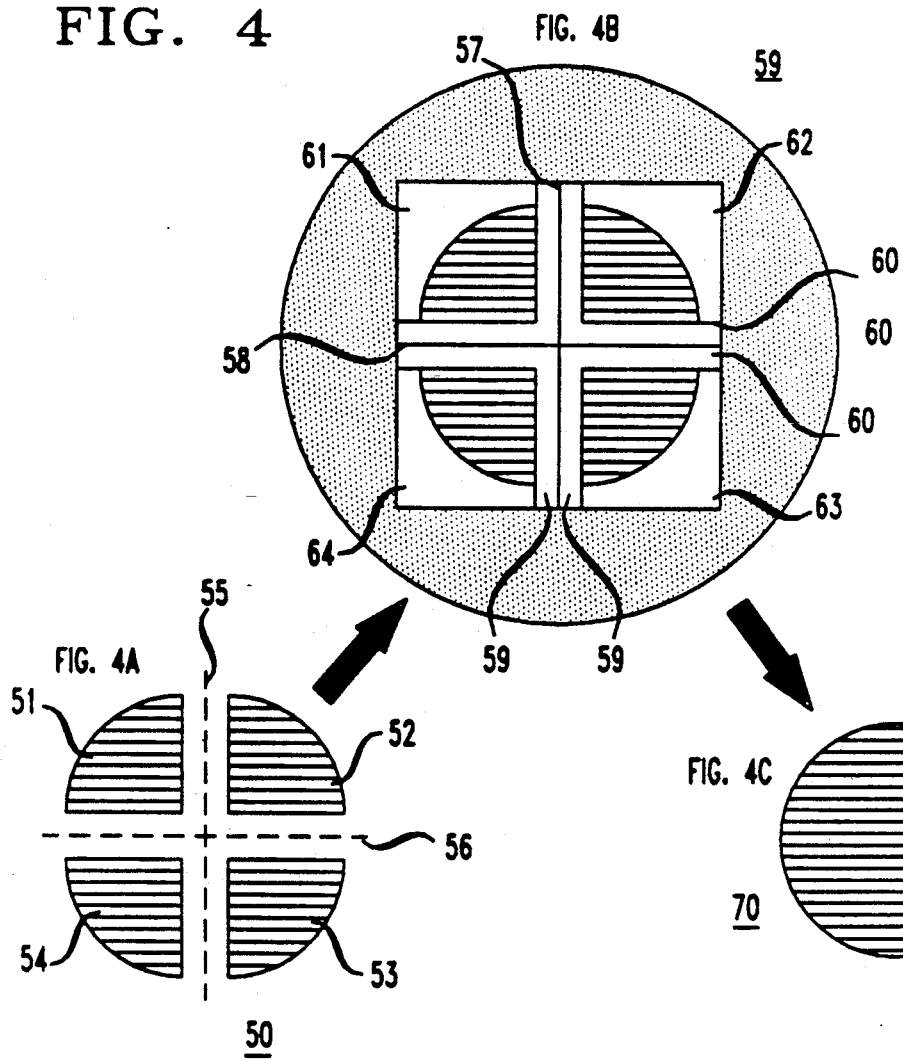

FIG. 4, in turn made up of three views, 4A, 4B and 4C, illustrates segmentation in the construction of a mask and construction of the final wafer image. Mask and wafer pattern, as shown, are of the same dimensions—corresponding with 1:1 mask-to-wafer projection. While permitted in accordance with the inventive teaching, preferred embodiments, at this time, provide for demagnification.

In FIG. 4A the pattern 50 has been segmented into quarters, 51, 52, 53, 54, to accommodate struts 55 and 56, at positions shown as dashed lines. FIG. 4B shows corresponding regions of a mask or mask portion 59, which for purposes of illustration is shown as supported on a circular section of material 60. In this figure, now-constructed struts 57 and 58 (at positions 55 and 56) are embraced by skirts 59 and 60, respectively. Pattern segments 51, 52, 53 and 54 are included in mask segments 61, 62, 63 and 64, respectively.

Sequential printing of segments 61 through 64 so juxtapositioned as to eliminate struts and skirts, 57, 58, 59, 60—so as to stitch the segments—results in the constructed image 70 as shown in view 4C.

General

As suggested under the Summary of the Invention, the mask may take a number of forms—may serve as or include a catalog of segments to be selected and positioned for stitching into the constructed wafer image. Permitted reduction in number of mask segments may yield advantages: reduced cost, reduced size, may permit redundancy (inclusion of two or more identical segments to allow for defects, thereby extending mask life), etc. It is expected that initial use of the invention will take the form of the direct extension of present practice in which a continuous chip pattern is simply segmented (by strut and skirt). consistent with the body of the disclosure, this section is largely in such terms.

The invention is dependent upon use of charged particle illumination—either electron or ion. Printing of successive segments by projection from the many-segmented mask takes advantage of the precise mass/-charge ratio for either form of illumination. Regardless of whether the inventive mode chosen entails step-and-repeat—with or without accompanying movement of the image and/or object stage during printing of a given segment—precise control to satisfy placement demands benefits by invariance of that ratio.

Figure 1:
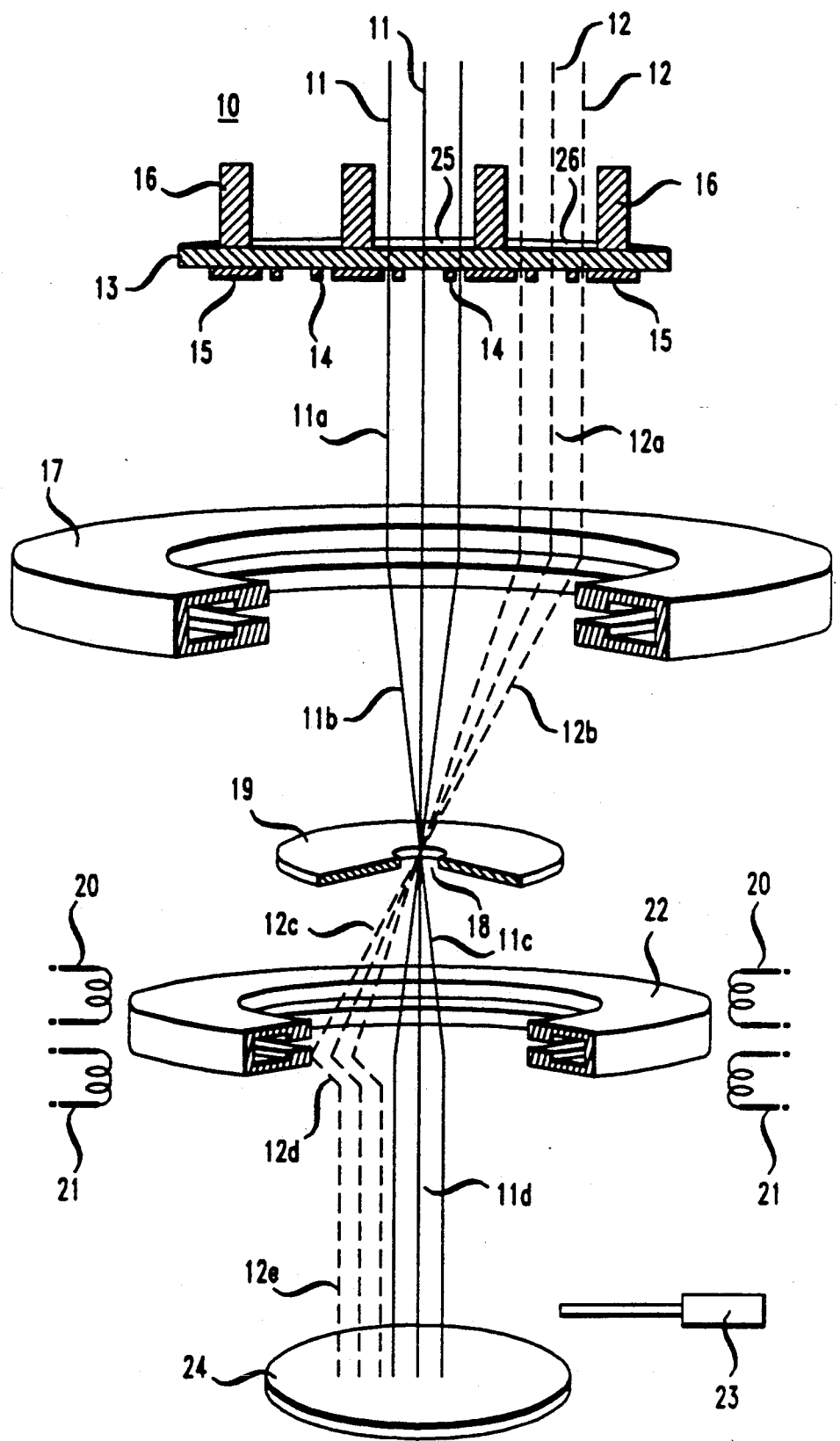
FIG. 1 is a diagrammatic perspective view of a segmented mask of the invention positioned on illustrative projection apparatus so equipped as to enable construction of the pattern on the image plane.

For the simplest mode in which the entirety of a strut-identified segment is projected simultaneously, stitching may be the exclusive domain of program-controlled energization of deflectors such as elements 20 and 21 of FIG. 1. For one mode the lithography step entailing stitching, involves mechanical movement as well. In this mode, both mask and wafer stage are moved-at velocity ratio to accommodate mask-to-wafer size ratio (e.g. the 4:1 mask-to-wafer image ratio contemplated with velocity ratio increased to the extent required by strut/skirt segment separation). For the two-lens system shown, movement of mask and wafer are opposite.

Other modes of operation are contemplated and derive equal value from the inventive approach. One such, entails rastor scan by use of a beam of small diameter relative to the segment to be projected. This version may profit as well from the skew scan approach of the U.S. patent application Ser. No. 07/852272.

Mask Design

As indicated, mask design is here discussed in terms of a simple continuous pattern mask, however, provided with the struts and skirts of the teaching. Further, discussion is generally of the preferred embodiment entailing both electron irradiation, and use of a continuous, non-apertured, scattering-non-scattering mask particularly suitable to electron irradiation. Where specific, description of the mask is illustratively in terms of a 4×reduction system designed to image a 17×35 mm DRAM chip. Minimum mask size allows for a 30% overhead on linear dimensions to accommodate struts and skirts, resulting in a 90×180 mm mask. Grillage is designed to hold the mask flat to within ±2 μm.

Membrane Area—The maximum unsupported membrane area may be derived from the following formulae, which relate the differential pressure, P, applied to the membrane to the maximum deflection, δ, of the membrane and the stress, σ, developed in the membrane:

$$P = \frac{4\delta t}{r^2} \left( \sigma_0 + \frac{2Et^2}{3(1-v)r^2} \right)$$

$$\sigma_f = \left( \frac{E\delta_{max}^2}{2r^2} \right) = \left( \frac{P_{max} r^2}{4t\delta} \right)$$

where r = membrane radius, t = membrane thickness and $\sigma_f$ = failure strength. A failure strength of ≈1GPa, as experimentally observed for 0.1 μm thick polycrystalline silicon membranes corresponds with a differential pressure of ≈0.9 atmosphere for a segment dimension of 1.2 mm—a value sufficient to meet contemplated requirements.

Grillage Structure—Specific requirements are considered outside the province of this description. An illustrative structure is described in conjunction with FIG. 2. Most important, the inventive approach depends upon definition of the region to be printed by skirts—skirts desirably defined during the same delineation/development process used for feature generation on the region to be printed. Expedient stitching to result in desired precision is so permitted. As discussed, skirts may serve an ancillary purpose—under proper operating conditions, they may be of such width as to absorb or scatter delineating energy in the beam wiring to substantially avoid or lessen heating of the struts. Heating might otherwise result in strut expansion to result in mask distortion requiring more involved stitching control. Under experimental conditions, a 50 kV accelerated electron beam of nominal cross-section of 1 mm, has been observed to have fall-off regions ("wings") that extend a heating-meaningful distance of 100 μm. Avoidance of strut heating, in consequence, is accomplished by similarly dimensioned skirts. In this illustration, segment overhead, including 100 μm struts, totals 300 μm. A mask print area of 1×1 mm² accordingly requires a membrane region of 1.3×1.3 mm between struts (= to 30% overhead).

Other considerations applicable to mask design are given by Timoshenko, "Theory of Plates and Shells", McGraw Hill (1940). Relationships set forth at pp. 228, 229 yield permitted mask dimensions for a maximum deflection, δ, of 1 to 2 μm. Corresponding overall grillage dimensions—the dimension of the entire working mask—as calculated are 10 cm for the shorter strut-to-strut span for a 2:1 rectalinear grill and 15 cm for a square grill. Fotoform ® glass is exemplary of a class of photosensitive glasses compatible with a polysilicon membrane and otherwise meeting requirements assumed above.

Detailed consideration of software appropriate to practice of the invention—particularly with regard to stitching/image reconstruction—is not considered within the province of this description. The invention is described primarily in terms of expeditious use of the facility afforded by dependable mass:charge relationship of ions or electrons and by attainable velocity control. It is realization of this characteristic which gives rise to the inventive advance. Programming/software to take the various factors into account, and, to so, result in precise image reconstruction is known.

Setup Procedure

The various factors required for assurance of contemplated image reconstruction have been adequately set forth. The entire process may be carried out concurrently with wafer-by-wafer fabrication. Under many circumstances, however, where fabrication of many identical wafers is contemplated, some saving in time and expense is realized by providing for the various corrections—aberrations/distortions—in an initial procedure to result in appropriate calibration and correction in fabrication. While it is conceivable that changing conditions may require repeated calibration/correction, it is anticipated that fabrication of many wafers will be permitted without change. Under one set of contemplated circumstances, it is expected that calibration may be on a day-by-day basis.

We claim:

1. Method for device fabrication comprising at least one lithographic delineation step, comprising projection on an imaging material of charged particles containing imaging information comprising a continuous image, such particles being of velocity determined by an accelerating field, imaging information being imposed on such particles by passage through imaging regions of a mask, characterized in that included imaging regions correspond with mask segments, a plurality of which are required to define such continuous image on the imaging material, in that segmentation is the consequence of (1) struts of dimension and rigidity to assure mechanical reliability by supporting struts and of (2) lithographically-defined skirts adjacent such struts, so defining continuous skirts intermediate imaging regions and struts, imaging entailing deflection of imaging particles by interaction with direction-changing field of such timing and magnitude as to redirect particles to eliminate both struts and skirts in such image as constructed.

2. Method of claim 1 in which mask segments are defined by at least one set of struts and skirts which are substantially parallel.

3. Method of claim 2 in which there are at least two such sets which intersect to define such segments.

4. Method of claim 3 in which segments are defined by two such sets in orthogonal relationship thereby resulting in segments which are rectalinear.

5. Method of claim 2 in which such device consists essentially of an integrated circuit having a least functional dimension which is smaller than 0.5 μm.

6. Method of claim 5 in which such particles are electrons, in which accelerating voltage is at least about 50 kV, in which segmenting regions comprise continuous, unapertured, membrane supporting said blocking regions and skirts both of which statistically scatter transmitting electrons to substantially reduce likelihood of arrival on the said imaging material thereby defining such image as constituted of statistically unscattered electrons transmitted through mask regions intermediate blocking regions.

7. Method of claim 5 in which projection imaging entails reduction of the mask image.

8. Method of claim 7 in which reduction is linearly at a ratio of at least 2:1, and in which the said membrane in the said plurality of regions is of a thickness of a maximum of about 2000 Å.

9. Method of claim 8 in which projection entails successive instantaneous image projection of successive segment-containing images.

10. Method of claim 2 in which such particles are ions, in which accelerating voltage is at least 50 kV, in which segmenting regions comprise membrane of substantial absorptivity for resulting accelerated ions, such membrane being apertured so that imaging information consists essentially of resulting apertures and retained, unapertured, membrane material within enclosed imaging regions.

11. Method of claim 2 in which at least two adjacent segments as positioned on the mask are used at least once to yield adjacent image regions in the continuous image on the imaging material with segments as differently positioned on the imaging material relative to the mask being denoted catalog segments.

12. Method of claim 11 in which substantially all adjacent regions as positioned on the mask are adjacent in such continuous image so that substantially the entirety of such continuous image is constituted of catalog segments.

13. Method of claim 2 in which at least two adjacent segments as positioned on the mask are at least once separated by one or more other projected segments in the continuous image on the imaging material, segments as differently positioned on the imaging material relative to the mask being denoted catalog segments.

14. Method of claim 13 in which at least one catalog segment is projected at least twice to result in repeated imaging in construction of such image.

15. Method of claim 13 in which at least two catalog segments are identical, the said method entailing choice as between such at least two catalog segments.

16. Method of claim 13 in which the number of mask segments is reduced relative to the number of projected segments required in the said image as constructed.

17. Method of claim 1 in which mask segments positionally correspond with imaging regions so that each mask segment is projected once during image construction.

* * * * *